(12) United States Patent
Cuttino et al.

(10) Patent No.: US 7,259,496 B2
(45) Date of Patent: Aug. 21, 2007

(54) TUNABLE VIBRATORY ACTUATOR

(75) Inventors: James Franklin Cuttino, Charlotte, NC (US); Jerald Lee Overcash, Kannapolis, NC (US); Jeroen Arend Antoon van Assen, Waalre (NL)

(73) Assignee: University of North Carolina at Charlotte, Charlotte, NC (US)

( * ) Notice: Subject to any disclaimer, the term of this patent is extended or adjusted under 35 U.S.C. 154(b) by 630 days.

(21) Appl. No.: 10/409,746

(22) Filed: Apr. 8, 2003

(65) Prior Publication Data

US 2004/0155558 A1    Aug. 12, 2004

Related U.S. Application Data

(60) Provisional application No. 60/370,254, filed on Apr. 8, 2002.

(51) Int. Cl.
*H01L 41/09* (2006.01)
*H02N 2/00* (2006.01)

(52) U.S. Cl. .................... 310/317; 310/328

(58) Field of Classification Search ........... 310/317, 310/358, 359, 328; 82/1.11, 1.18
See application file for complete search history.

(56) References Cited

U.S. PATENT DOCUMENTS

| | | | |
|---|---|---|---|
| 4,044,283 A | 8/1977 | Allison | 318/128 |
| 4,911,044 A | 3/1990 | Mishiro et al. | 82/158 |
| 5,218,893 A | 6/1993 | Shikata | 82/1.11 |
| 5,431,010 A | 7/1995 | Stone | 60/204 |
| 5,438,554 A | 8/1995 | Seyed-Bolorforosh et al. | 367/140 |
| 5,563,465 A * | 10/1996 | Nakahara et al. | 310/328 |
| 5,633,554 A * | 5/1997 | Kaji | 310/328 |
| 6,052,251 A | 4/2000 | Mohajerani et al. | 360/78.05 |
| 6,201,629 B1 | 3/2001 | McClelland et al. | 359/223 |
| 6,273,538 B1 | 8/2001 | Mitsuhashi et al. | 347/11 |

FOREIGN PATENT DOCUMENTS

| | | | | |
|---|---|---|---|---|
| JP | 62-81984 | * | 4/1987 | 310/328 |
| JP | 5-184172 | * | 7/1993 | 310/328 |
| JP | 5-304323 | * | 11/1993 | |

OTHER PUBLICATIONS

Arthur C. Miller "Performance Optimization of a Fast Tool Servo for Single-point Dimond Turning Machines" IEEE . Jun. 1999.*
Stephen J. Ludwick, et al., "A Rotary Arm Based Turning Machine for Ophthalmic Lenses", *The American Society for Precision Engineering*, 1998 Proceedings, vol. 18, pp. 53-56.
Kenji Uchino, "Consideration of Loss" and "Vibration at the Antiresonance" ,1997, *Piezoelectric Actuators and Ultrasonic Motors*, p. 199.

* cited by examiner

*Primary Examiner*—Thomas M. Dougherty
(74) *Attorney, Agent, or Firm*—Kennedy Covington Lobdell & Hickman, LLP

(57) ABSTRACT

A tunable machining tool having a plurality of actuator devices, each operating at a uniform frequency but phase shifted by a controllable amount so as to create an vibratory output at a frequency that is a multiple of the input frequency.

22 Claims, 10 Drawing Sheets

*Fig. 5B*
*Fig. 5A*
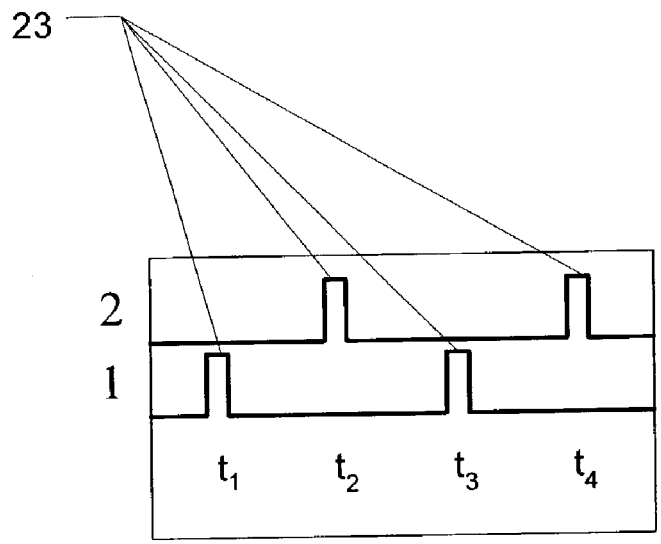
Input Signals
*Fig. 6*
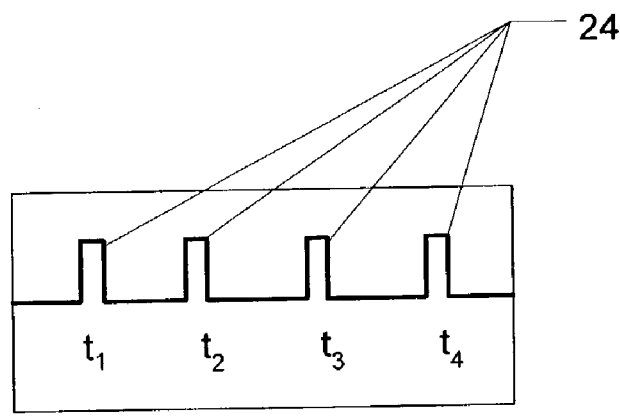
Output Displacement

TUNABLE VIBRATORY ACTUATOR

CROSS-REFERENCE TO RELATED APPLICATION

This application is entitled to the benefit of, and claims priority to, provisional U.S. Patent Application Ser. No. 60/370,254 filed Apr. 8, 2002 and entitled "A TUNABLE CUTTING TOOL FOR VIBRATION ASSISTED DIAMOND TURNING," the entirety of which is hereby incorporated by reference.

BACKGROUND OF THE PRESENT INVENTION

1. Field of the Present Invention

The present invention relates generally to vibratory mechanical actuation devices, and, in particular, to tunable machining tools utilizing a plurality of actuator devices.

2. Background

Actuator mechanisms capable of creating high-frequency, vibratory movement at very small, precise amplitudes are used in a variety of fields. Because of their unique properties, piezoelectric actuators are among the most widely used mechanisms for this type of actuator. For example, vibration assisted diamond turning, referred to herein as "VADT," is a known technique that enables the use of diamond tools to machine brittle materials without excessive wear. Researchers are not sure why the technique reduces wear. Many postulate that the vibration motion allows the tool to leave the workpiece momentarily, allowing either cooling, the penetration of cutting fluids into the area of material removal, or other mechanisms. The systems apparently only work when the maximum linear velocity of the tool exceeds the linear velocity of the part being machined. In diamond turning applications, performance parameters on the order of 40 kHz vibrations with amplitudes of 6-8 micrometers are desired.

Current VADT systems have been in use for a number of years. However, developing a tool that can vibrate at those frequencies and amplitudes is non-trivial. Most commonly, known systems rely on small, piezoelectrically-driven motions to excite natural frequencies in a tool bar, resulting in amplification of the output displacement and creating the desired motion. However, previous ultrasonic vibration cutting systems, such as those disclosed in U.S. Pat. No. 5,218,893 to Shikata et al. and U.S. Pat. No. 4,911,044 to Mishiro et al., utilize tools having a fixed resonant frequency, and such systems are not easily modified to change either the amplitude or the frequency of tool motion. In addition, the response is affected by damping caused when the tool contacts the workpiece and begins to cut, thus making the system dynamics variable and nonlinear.

One significant drawback of previous actuator-driven systems such as VADT is the absence of a means for tuning the actuators. If an actuator could be tuned, then the mechanics of the material removal process could be more thoroughly examined through the ability to deterministically vary the vibration parameters. In addition, however, a tunable actuator would enable the machine or process to adapt the nature of the vibration to changing cutting conditions. For example, in diamond turning, since linear velocity is the product of the radius from the center of a workpiece times angular velocity, which is constant, the linear velocity of the cutting tool along the surface of the workpiece varies as the tool approaches the center of the workpiece. This means that the linear speed of the tool changes throughout the cutting operation. In prior art systems, which are resonant frequency-based systems, the frequency of operation cannot be easily modified and thus will remain constant throughout this dynamic cutting process. A tunable tool would allow compensation for the changes in linear velocity.

Examples of other applications in which stacks of piezoelectric actuators, driven at a high frequency by a single impulse signal, include U.S. Pat. No. 5,431,010 to Stone, which discloses a high speed, amplitude variable thrust control method; U.S. Pat. No. 6,273,538 to Mitsuhashi, which discloses a method of using a pulsed piezoelectric stack to drive an ink jet head; U.S. Pat. No. 6,052,251 to Mohajerani et al., which discloses an actuator arm integrated piezoelectric micro actuator; and U.S. Pat. No. 5,438,554 to Seyed-Bolorforosh et al., which discloses a tunable acoustic resonator for clinical ultrasonic transducers. However, no known system utilizes two or more impulse signals in concert to produce a higher output frequency.

The use of torsional flexure in other applications has been established. For example, U.S. Pat. No. 6,201,629 to McClelland et al. discloses the use of a torsional micromechanical mirror system, while U.S. Pat. No. 4,044,283 to Allison discloses the use of an electromechanical resonator. The use of a rotary arm based turning machine for ophthalmic lenses is also known. However, although it is well known that a rotational flexure generally has a higher natural frequency, and potentially lower inertia, than a translational flexure there are no elastic torsional flexures known which rely on these characteristics and use multiple actuator devices to produce frequencies greater than that achievable using a single actuator device.

SUMMARY OF THE PRESENT INVENTION

A system has been developed to provide variable frequencies and amplitudes of a device requiring motions that cannot be safely achieved by a single actuator. The example used to describe the technique is a device used to introduce a vibrational motion into the cutting tool of a lathe. The vibration is used to improve the material removal characteristics of brittle materials and to reduce wear. Although other devices have been developed to generate vibration, they are of fixed frequencies which greatly restrict the study of the material removal mechanics. The technique described was developed to allow for direct drive of the tool to provide vibrations of varying amplitudes and frequencies in real time.

Torsional and cantilevered flexures with a high resonant frequency and a technique for exciting the tool without damaging the piezoelectric drivers have been developed. Each flexure is driven by two or more multi-layer piezoelectric stacks, which have impulse input signals. The stacks may be arranged in numerous configurations, including series and parallel arrangements. The dynamics of the system serve as a low-pass filter and translates the impulse signals into a sinusoidal-like output displacement. If two actuators are used and driven by separate input signals, then if the two input signals are 180 degrees out of phase, a multiplication of the individual drive frequency occurs, resulting in a higher output frequency of the system. In this way, the heat developed by the PZTs is minimized and operation is optimized. By choosing the pulse width to be equal to the time period of the first natural frequency of the combined system, resonance ringing in between the pulses is cancelled out. Therefore interference between the two PZT output signals is not present, resulting in a clear system output signal.

The present invention comprises a tunable piezoelectric vibratory actuator and methods of creating vibratory movement using such an actuator. Broadly defined, the present invention according to one aspect includes a method of creating vibratory movement in a mechanical flexure via a plurality of actuator devices, the method comprising the steps of: establishing an input frequency, the input frequency defining a cyclical period; periodically applying a first vibrational force, via a first actuator device, to a mechanical flexure, the first vibrational force being applied at the input frequency and occurring at a first point in time in the cyclical period; and periodically applying a second vibrational force, via a second actuator device, to a mechanical flexure, the second vibrational force being applied at the input frequency and occurring at a second point in time in the cyclical period; wherein the amount of time between the first point in the cyclical period and the second point in time in the cyclical period defines a phase shift, and wherein the phase shift is established as a function of the total number of actuator devices applying vibrational force to the mechanical flexure.

In features of this aspect, the phase shift, expressed as a fraction of the cyclical period, is equal to 1 divided by the total number of actuator devices applying vibrational forces to the mechanical flexure; exactly two actuator devices are utilized to apply vibrational forces to the mechanical flexure, and wherein the phase shift between the periodic application of the first vibrational force to the mechanical flexure and the periodic application of the second vibrational force to the mechanical flexure is 180 degrees, or exactly three actuator devices are utilized to apply vibrational forces to the mechanical flexure, and wherein the phase shift between the periodic application of the first vibrational force to the mechanical flexure and the periodic application of the second vibrational force to the mechanical flexure is 120 degrees; the first actuator device is a piezoelectric actuator, and the step of periodically applying a first vibrational force to the mechanical flexure includes activating the piezoelectric actuator by applying an electric field thereto; the step of periodically applying the first vibrational force, via the first actuator device, to the mechanical flexure includes translating the periodically-applied first vibrational force to the mechanical flexure via the second actuator device, or the step of periodically applying each vibrational force to the mechanical flexure includes applying each vibrational force to the mechanical flexure without applying such force to the any other actuator device; the mechanical flexure is a torsional flexure; and the mechanical flexure is a cantilevered flexure.

In another aspect of the present invention, a method of creating vibratory movement in a mechanical flexure via a plurality of actuator devices includes: establishing an input frequency, the input frequency defining a cyclical period; separately applying a plurality of periodic vibrational forces to a mechanical flexure, wherein each e step of applying includes periodically applying a vibrational force, via a respective actuator device, to the mechanical flexure, the first vibrational force being applied at a first frequency, the first frequency defining a cyclical period; and controlling the application of the periodic vibrational forces such that the mechanical flexure vibrates at a second frequency; wherein the second frequency is a mathematical product of the first frequency times the number of separate actuator devices utilized in the step of separately applying a plurality of periodic vibrational forces to the mechanical flexure.

In still another aspect of the present invention, a piezoelectric vibratory actuator includes: a plurality of piezoelectric actuator devices, the plurality of piezoelectric actuator devices collectively having at least one free end, wherein each actuator device includes a piezoelectric body that expands along an axis of expansion when subjected to an electric field, and wherein the actuator devices are arranged such that the respective axes of expansion are parallel and not collinear; a separately-controllable activation circuit for each actuator device; and a mechanical coupler, disposed at the at least one free end of the plurality of piezoelectric actuator devices, for translating individual forces applied thereto by the separately-controlled actuator devices to a common actuation point.

In a feature of this aspect, the coupler is hemispheric in shape.

In other features of this aspect, one end of each piezoelectric actuator device is disposed in direct contact with the coupler; and the free end of the plurality of piezoelectric actuator devices is a first end, wherein the plurality of piezoelectric actuator devices collectively have a second end opposite the first end, and wherein the vibratory actuator further comprises a second mechanical coupler, disposed at the second end of the plurality of piezoelectric actuator devices.

In yet another aspect, a vibratory machining device includes: a cutting tool assembly, having a cutting tool supported by a cutting tool mount; and a vibratory actuator for imparting vibratory movement to the cutting tool, the vibratory actuator having a plurality of separately-controllable actuator devices, each of which is independently operable to impart vibratory movement to the cutting tool, and a controller that activates each actuator device at a common frequency, the frequency defining a cyclical period, wherein the activation of each actuator device occurs at a phase shift relative to the other actuator devices.

In features of this aspect, the phase shift of each actuator, expressed as a fraction of the cyclical period, is equal to 1 divided by the total number of actuator devices imparting vibratory movement to the cutting tool; each actuator device is a piezoelectric actuator device, and the controller activates each actuator device via a dedicated activation circuit; the cutting tool is formed from carbide; the cutting tool is at least partially formed from diamond; and the device further includes a workpiece support, adjustably connected to the cutting tool assembly.

BRIEF DESCRIPTION OF THE DRAWINGS

Further features, embodiments, and advantages of the present invention will become apparent from the following detailed description with reference to the drawings, wherein:

FIG. 5A is a graphical representation of the displacement caused over time by the first piezoelectric actuator of FIGS. 4A-4F;

FIG. 5B is a graphical representation of the displacement caused over time by the second piezoelectric actuator of FIGS. 4A-4F;

FIG. 6 is a graphical representation of the displacement caused over time by the combined piezoelectric actuators of FIGS. 4A-4F;

DETAILED DESCRIPTION OF THE PREFERRED EMBODIMENTS

Figure 1:
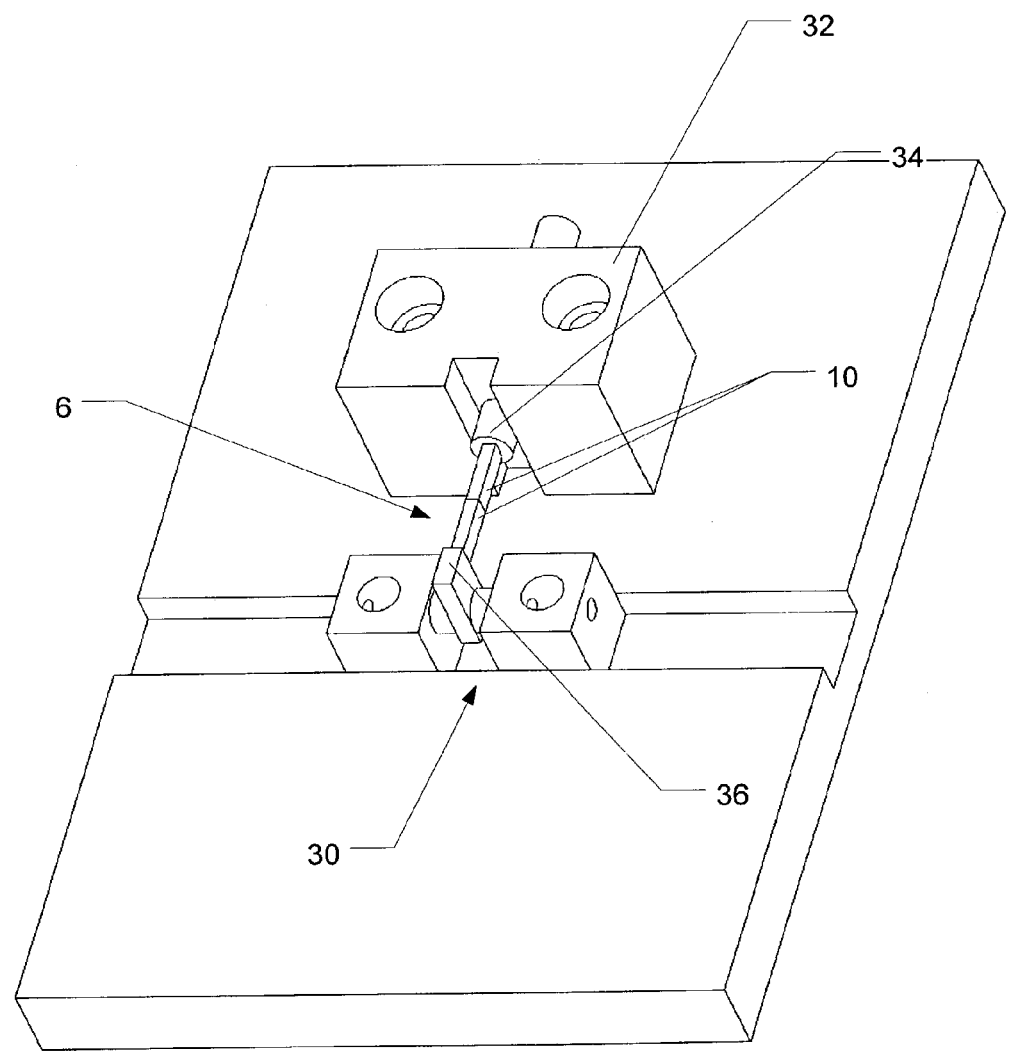
FIG. 1 is a perspective view of a torsional, series-actuated vibrator in accordance with a first preferred embodiment of the present invention.

Referring now to the drawings, in which like numerals represent like components throughout the several views, the preferred embodiments of the present invention are next described. FIG. 1 is a perspective view of a torsional, series-actuated vibrator 5, utilizing a series of piezoelectric actuator bodies, in accordance with a first preferred embodiment of the present invention. The torsional vibrator 5 includes a series vibratory actuator 6, a torsional flexure 30, an actuator mounting block 32 and a piezo preloading screw 34.

Figure 2:
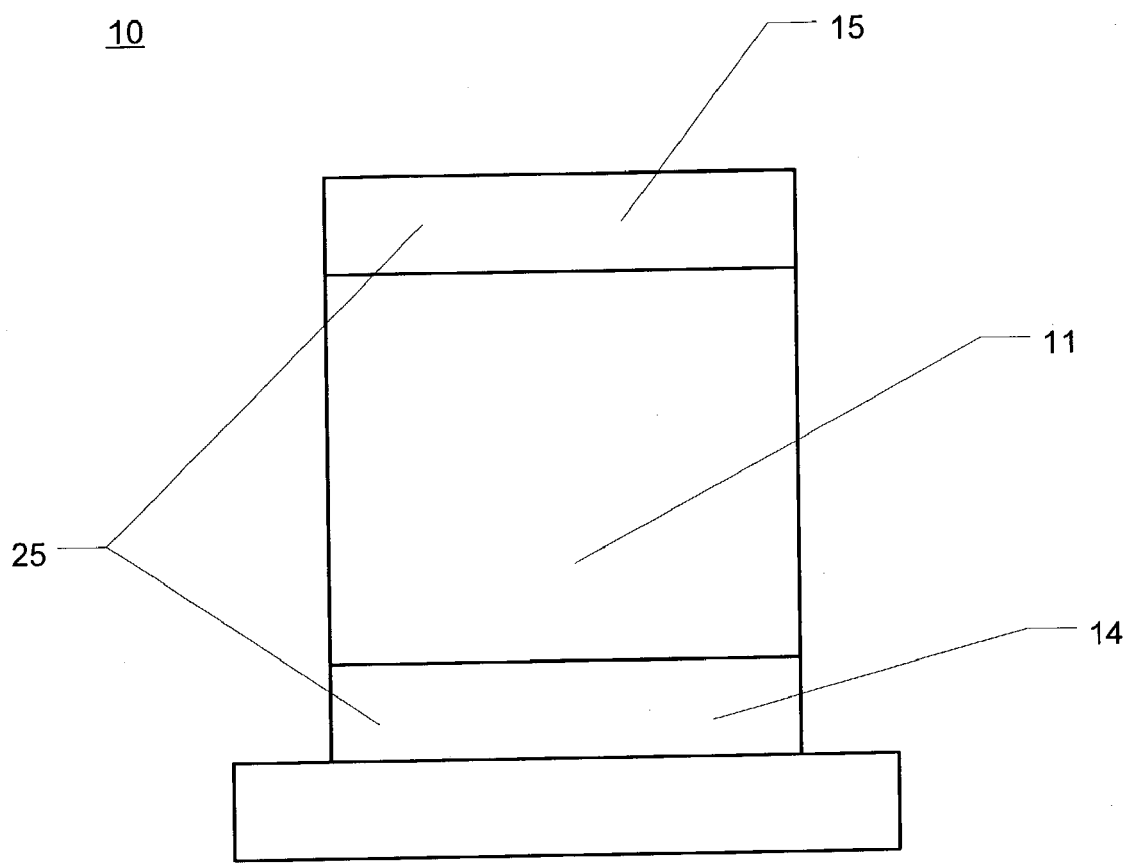
FIG. 2 is a side view of an exemplary actuator device suitable for use with the preferred embodiments of the present invention.

The series vibratory actuator 6 shown in FIG. 1 includes a plurality of piezoelectric actuator devices 10 arranged in series between the preloading screw 34 and the torsional flexure 30. It should be apparent, however, that a wide variety of alternative arrangements are likewise possible. FIG. 2 is a side view of an exemplary actuator device 10 suitable for use with the preferred embodiments of the present invention. As shown therein, each actuator device 10 includes a body of piezoelectric material 11 and a mechanical system 25. The piezoelectric material is preferably in solid solution form. The actuator body 11 may be either a single crystal actuator or a stack of these actuators, as described in U.S. Pat. No. 6,048,394 to Harmer et al. In practice, when using stacked actuators, it is often necessary to apply a preload to realize optimal performance. An actuator body suitable for use in the preferred embodiments of the present invention is a multilayer piezoelectric actuator with an overall length of 10 millimeters such as Model No. AE0203D08 from NEC/Tokin of Union City, Calif. The electric field is typically applied as a voltage to electrodes (not shown) deposited on at least two surfaces of the actuator body 11.

The actuator device 10 illustrated in FIG. 2 is just one type of a wide variety of well known actuator devices 10. This actuator device 10, commonly referred to as a "stack-type" or "cylindrical" actuator, provides motion control in the vertical "x" direction. The actuator body 11 may be in the form of a solid cylinder, as shown, or in the form of a hollow cylinder, and may be formed unitarily or may be formed from a plurality of stacked disks or rings. The mechanical system 25 includes a base 14, which is fixed in place on the actuator mounting block 32, another actuator device 10, or the like, and an end cap 15. The base 14 and end cap 15 are both formed from a generally rigid material that maintains its size and shape when passed through an electric field. One end of the actuator body 11 is attached to the base 14, and the end cap 15 is attached to the other end of the actuator body 11. When an electric field is applied to the actuator body 11, it expands or contracts according to the magnitude of the field, and the end cap 15 is correspondingly caused to move out or in. The end cap 15 is thus the mechanism by which the expansion and contraction of the actuator body 11 is transmitted.

Figure 3:
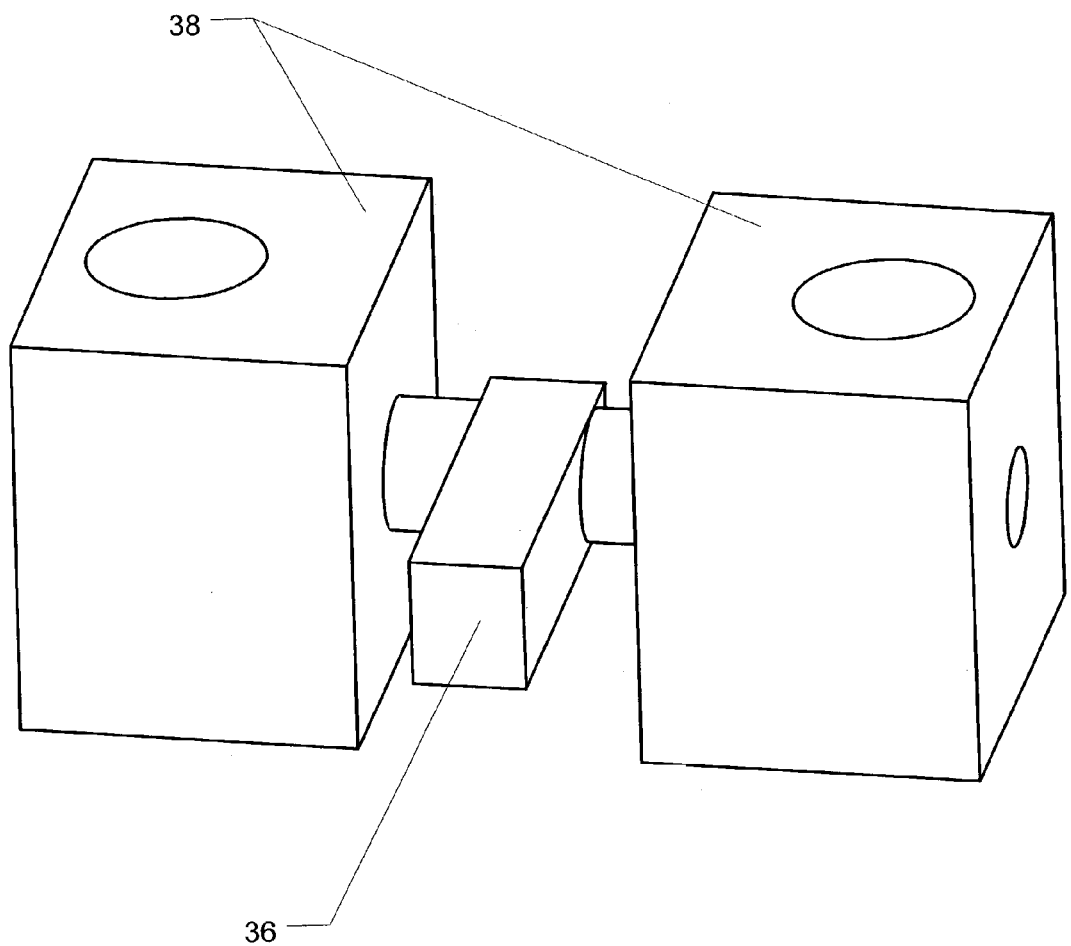
FIG. 3 is a perspective view of an exemplary torsional flexure for use in a torsional vibrator.

FIG. 3 is a perspective view of an exemplary torsional flexure 30 for use in a torsional vibrator 6. Although not identical in proportions to the torsional flexure shown in FIG. 1, the construction of the torsional flexure shown in FIG. 3 is the same. The torsional flexure 30 includes a vibratory arm or beam 36 and a fixture 38. The vibratory arm 36 is arranged such that one end is rigidly held in place by the fixture 38, while the other end is free to vibrate rotationally. The materials, dimensions, proportions and design of the flexure 30 are dependent upon the particular application for which it is to be used, but in an exemplary embodiment suitable at least for research and test purposes, the flexure may be formed from a mild steel alloy or another elastic material such as molybdenum or alloys thereof, or copper beryllium.

As shown in FIG. 1, the actuator mounting block 32 comprises a solid block of material having a cylindrical, threaded central bore therethrough for supporting the piezo preloading screw 34 and one or more mounting openings. The mounting block 32 may be formed from a mild steel alloy, aluminum, or another structural material. The preloading screw 34, comprising a threaded rod of an invar alloy, is disposed within the correspondingly-threaded central bore of the actuator mounting block 32, and the vibratory actuator 6 is disposed between the end of the preloading screw 34 and the vibratory arm 36 of the torsional flexure 30 and held in place by compression, a preload force, adhesives, or the like. The preloading screw 34 is a fine-pitch set screw that may then be turned to adjust the preload on the serial vibratory actuator 6. Various sensors, gages or the like may be used to measure displacement during the initial setup stage, during research and testing, and during actual operation for the purpose of providing feedback information to ensure proper displacement. One sensor suitable for use with the preferred embodiments of the present invention is an Opto-Acoustics optical displacement sensor with an integral adjustable amplifier.

Figure 4:
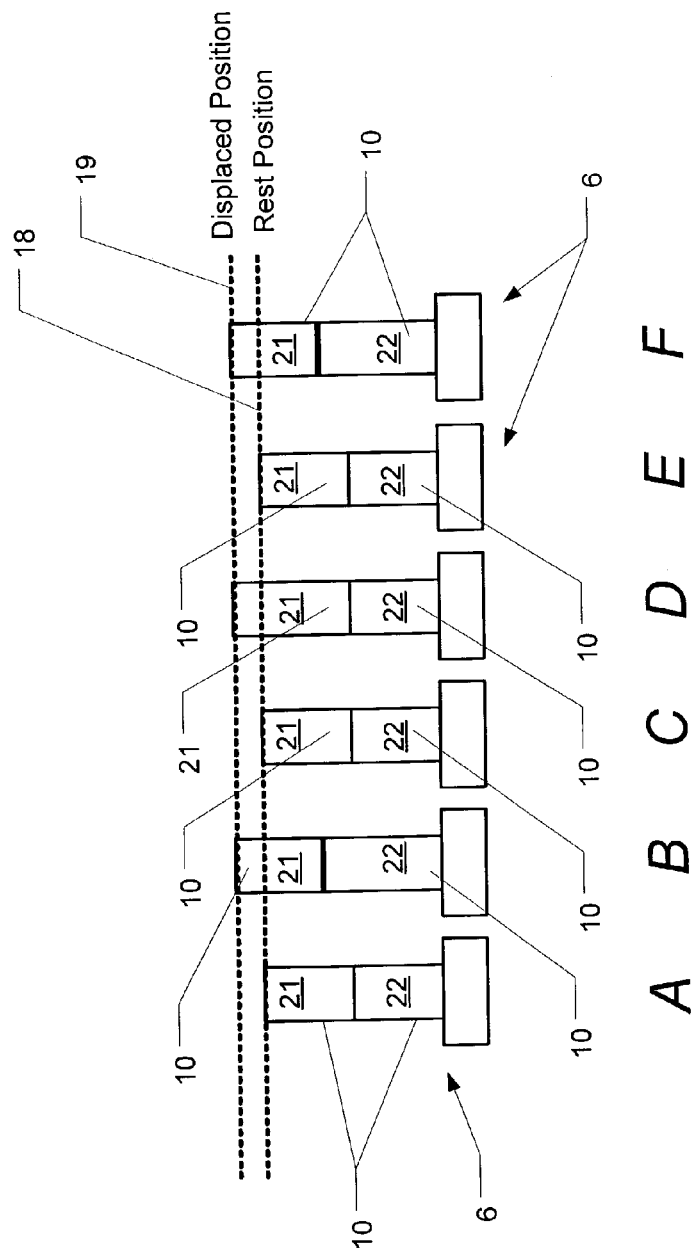
FIGS. 4A-4F are schematic representations collectively illustrating the cyclical activation and deactivation of the piezoelectric actuator bodies of FIG. 1.

In operation, the actuator devices 10 in the vibrator 5 may be selectively activated and deactivated separately by applying a separate electric field to each actuator device 10. This activation/deactivation process is controlled such that the various actuator devices 10 are activated in a predetermined sequence. In the present invention, the actuator devices 10 are preferably controlled such that no two actuator devices 10 being activated at the same time. FIGS. 4A-4F are schematic representations collectively illustrating the cyclical activation and deactivation of the piezoelectric actuator devices 10 of FIG. 1. As seen in FIG. 4A, in the absence of an electric field, the two piezoelectric actuator devices 10 remain in their natural, contracted state, referred to herein as their "rest position." As a result, the location of the upper end of the series vibratory actuator 6 remains steady, as shown by the "Rest Position" line 18. However, as shown in FIG. 4B, when the actuator body 11 of the first actuator device 21 is temporarily excited, it expands accordingly, and the upper end of the series vibratory actuator 6 is displaced by an amount equal to the expansion of the actuator body 11 of the first piezoelectric actuator device 21, as shown by the "Displaced Position" line 19. In FIG. 4C, the first actuator device 21 is once again deactivated, and the upper end of the series vibratory actuator 6 returns to its rest position. In FIG. 4D, the actuator body 11 of the second actuator device 22 is temporarily excited, causing it to expand accordingly, and the upper end of the series vibratory actuator 6 is once again displaced. Notably, because the second actuator device 22 is presented with the additional mass of the first actuator device 21 to displace, the displacement effected by the second actuator device 22 may be slightly less than that of the first actuator device 21. Nonetheless, if the actuator bodies 11 are generally similar, and are excited by similar electric fields, then the displacement of the upper end of the series vibratory actuator 6 will be nominally the same regardless of which piezoelectric actuator body 11 is excited. In FIG. 4E, the second actuator device 22 is once again deactivated, and the upper end of the series vibratory actuator 6 returns to its rest position. This cycle may then be repeated, beginning as shown in FIG. 4F.

FIGS. 5A and 5B are graphical representations of the displacements caused over time by the first and second actuator devices 21, 22 of FIGS. 4A-4F, respectively. In each graph, the horizontal axis represents time, while the vertical axis represents displacement. Thus, each square "pulse" 23 represents a temporary, short-duration displacement of the upper end of a single piezoelectric actuator device 10. The pulses 23 in FIG. 5A may be interpreted to correspond to the expansion of the first piezoelectric actuator device 21 shown in FIGS. 4B and 4F, while the pulses in FIG. 5B may be interpreted to correspond to the expansion of the second piezoelectric actuator device 22 shown in FIG. 4D, repeated cyclically. As shown, each actuator body 11 is excited on a periodic basis, at $t_1$, $t_2$, $t_3$ and $t_4$ to produce a displacement of a generally uniform magnitude, where the periods are the same, but where the expansion of the second actuator device 22 is 180 degrees out of phase from that of the first actuator device 21.

FIG. 6 is a graphical representation of the displacement caused over time by the series vibratory actuator 6 of FIG. 1. Because the upper end of the series vibratory actuator 6 is displaced every time either of the individual piezoelectric actuator bodies 11 is excited (i.e., at $t_1$, $t_2$, $t_3$ and $t_4$), the upper end of the series vibratory actuator 6 is displaced twice as often as either of the two individual actuator devices 21, 22. Further, because the displacements of the individual actuator bodies 11 are chosen to be uniform, the displacement 24 of the upper end of the series vibratory actuator 6 is likewise uniform. Finally, because expansion of the second actuator device 22 is 180 degrees out of phase from that of the first, the upper end of the series vibratory actuator 6 is displaced precisely at an operating frequency that is exactly twice the displacement frequency of either of the two individual actuator devices 21, 22.

It should be apparent that these same principles may theoretically be applied to any number of piezoelectric actuator devices 10. For example, in order to generate a 300 Hz output displacement, two actuator devices 10 may be used and excited at 150 Hz each; three actuator devices 10 may be used and excited at 100 Hz each; four actuator devices 10 may be used and excited at 75 Hz each; and so on. As long as the displacement caused by each individual actuator device 10 in the set is the same as the displacements caused by the other individual actuator devices 10, and the individual actuator bodies 11 are excited out of phase from each other by an amount proportional to the number of actuator devices 10 in the set, a uniform displacement may be produced at an output frequency that is a multiple of the input frequency.

Figure 7:
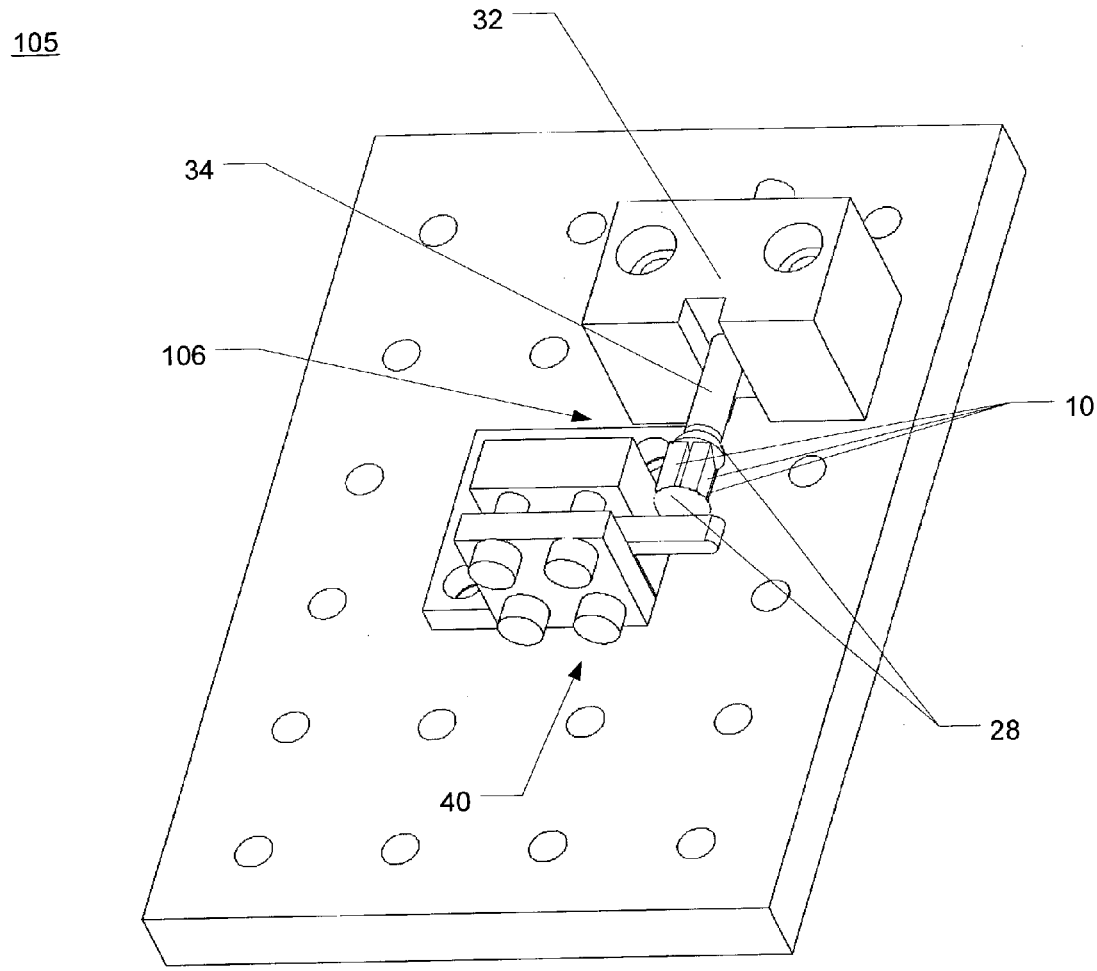
FIG. 7 is a perspective view of a cantilevered, parallel-actuated vibrator in accordance with a second preferred embodiment of the present invention.

FIG. 7 is a perspective view of a cantilevered, parallel-actuated vibrator 105 in accordance with a second preferred embodiment of the present invention. This vibrator 105 includes a parallel vibratory actuator 106, one or two hemispherical couplers 28, a cantilever beam flexure 40, an actuator mounting block 32 and a piezo preloading screw 34. Like the series vibratory actuator 6, the parallel vibratory actuator 106 primarily includes a plurality of piezoelectric actuator devices 10 of a type such as described previously, such as the device 10 shown in FIG. 2. However, in the parallel vibratory actuator 106, the actuator devices 10 are ganged in a parallel arrangement, rather than in a series arrangement. A hemispherical coupler 28 is disposed at at least one end of the ganged actuator devices 10 in order to provide more reliable interaction between the actuating devices 10 and the cantilever beam flexure 40 for purposes made clearer hereinbelow. Preferably, a second hemispherical coupler 28 is disposed between the opposite end of the ganged actuator devices 10 and the preloading screw 34 in order to ensure that the forces placed on the actuator devices 10 by the preloading screw are distributed more equally. It should be apparent, however, that other devices and structures may be substituted for either or both of the couplers 28 without departing from the scope of the present invention.

Figure 8:
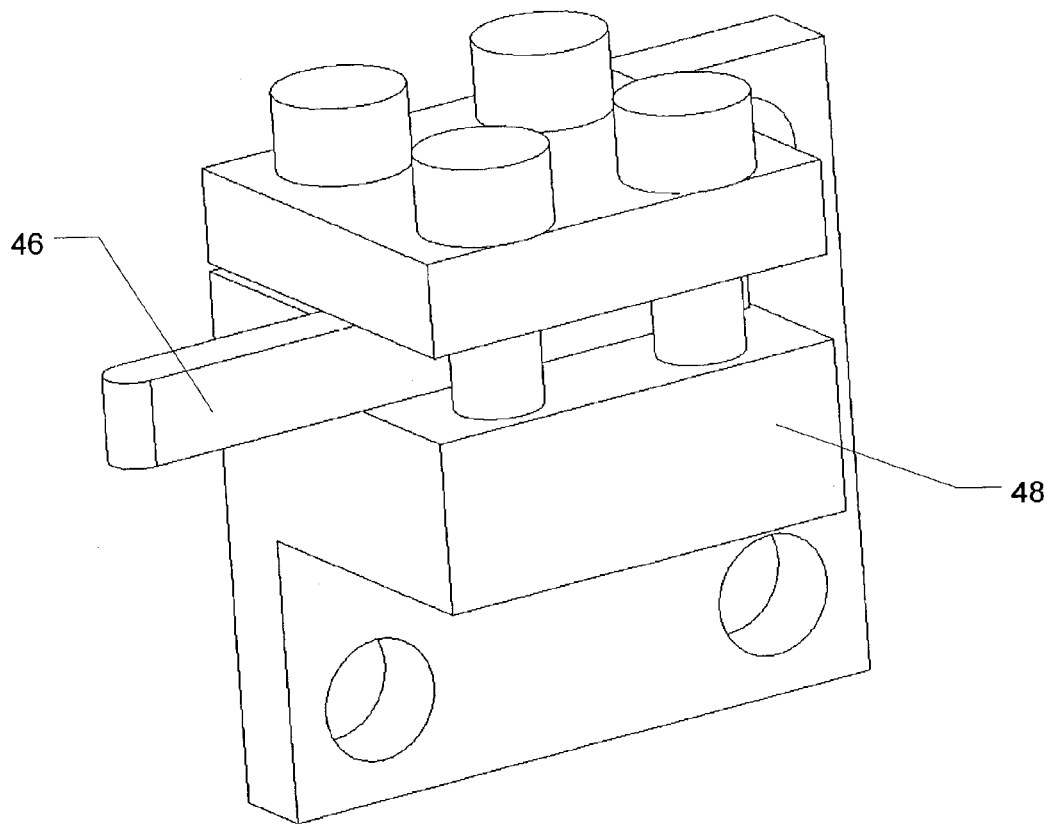
FIG. 8 is a perspective view of the cantilever beam flexure of FIG. 7.

FIG. 8 is a perspective view of the cantilever beam flexure 40 of FIG. 7. The cantilever beam flexure 40 includes a vibratory arm or beam 46 and a fixture 48. The vibratory arm 46 is cantilevered such that a significant portion of the beam is rigidly held in place in the fixture 48, while the rest of beam is free to vibrate. The materials, dimensions, proportions and design of the flexure 40 are dependent upon the particular application for which it is to be used, but in an exemplary embodiment suitable at least for research and test purposes, the flexure may be formed from a mild steel alloy or another high strength material such as molybdenum or alloys thereof, copper beryllium, or some stainless steels. The cantilever beam flexure 40 is rigidly fixed in place relative to the actuator mounting block 32, and a preloading screw 34 may be threaded through the mounting block 32 in order to permit the preload on the flexure 40 and actuator devices 10 to be adjusted. The design, construction and operation of both the mounting block 32 and the preloading screw 34 may be similar to that of the first embodiment, but other arrangements suitable for use with the present invention will be readily apparent to those of ordinary skill.

Figure 9:
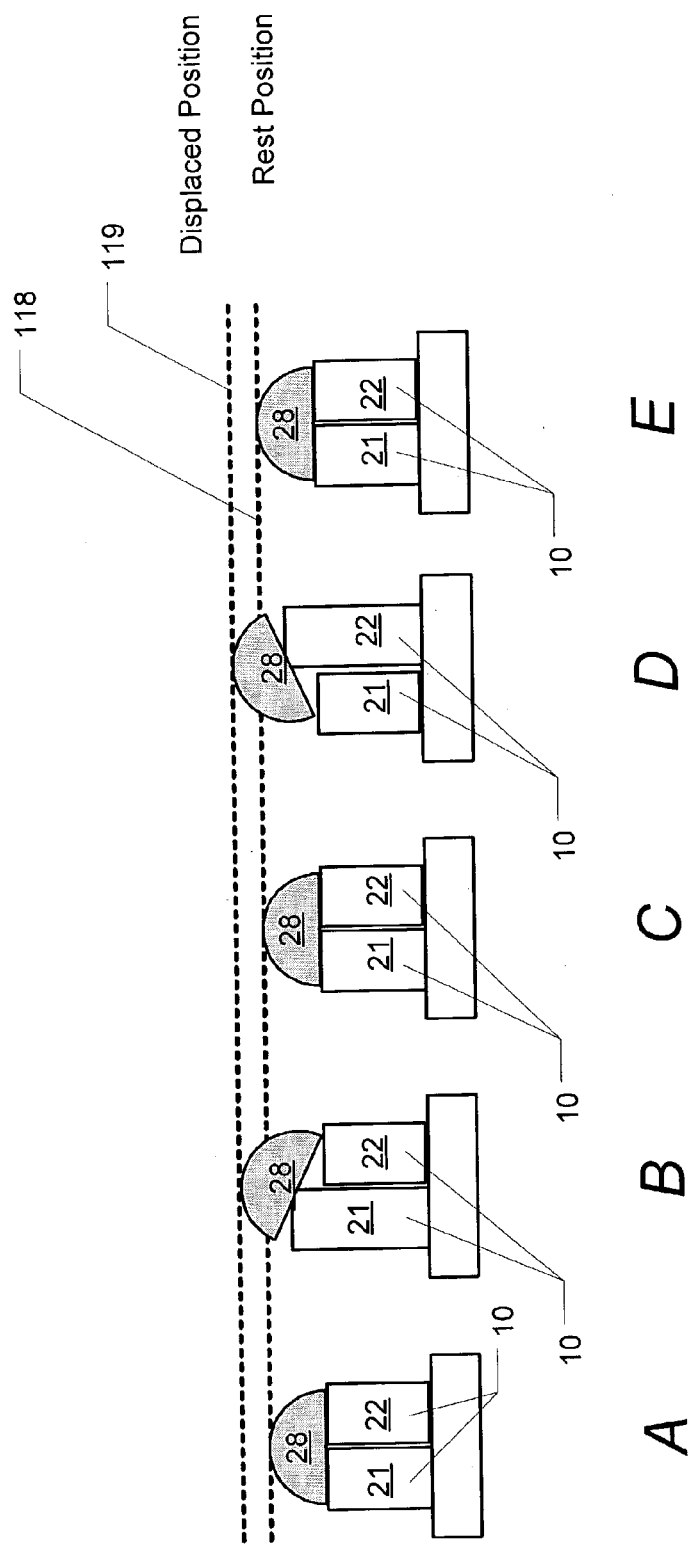
FIG. 9A-9E are schematic representations collectively illustrating the cyclical expansion and contraction of the piezoelectric actuator bodies of FIG. 6.

In operation, the actuator devices 10 in the cantilevered, parallel-actuated vibrator 105 may be selectively activated and deactivated separately by applying a separate electric field to each actuator device 10. As with the series-actuated vibrator 5, this activation/deactivation process is controlled such that the various actuator devices 10 are activated in a predetermined sequence, and in the present invention, the actuator devices 10 are preferably controlled such that no two actuator devices 10 being activated at the same time. FIGS. 9A-9E are schematic representations collectively illustrating the cyclical expansion and contraction of the piezoelectric actuator devices 10 of FIG. 7. As seen in FIG. 9A, in the absence of an electric field, the two piezoelectric actuator devices 10 remain in their rest position. As a result, the location of the upper end of the parallel vibratory actuator 106 remains steady as shown by the "Rest Position" line 118. However, as shown in FIG. 9B, when the actuator body of the first actuator device 21 is temporarily excited, it expands accordingly, which in turn tilts and translates the hemispherical coupler 28 upward. As a result, the upper end of the parallel vibratory actuator 106 is displaced by an amount that is proportional to the expansion of the actuator body 11 of the first actuator device 21, as shown by the "Displaced Position" line 119. In FIG. 9C, the first actuator device 21 is once again deactivated, and the upper end of the parallel vibratory actuator 106 returns to its rest position. In FIG. 9D, the actuator body 11 of the second actuator device 22 is temporarily excited, causing it to expand accordingly. As a result, the hemispherical coupler 28 is tilted upward, which in turn causes the upper end of the parallel vibratory actuator 106 to be displaced by an amount that is proportional to the expansion of the actuator body 11 of the second actuator device 22. If the actuator bodies 11 are generally similar, and are excited by similar electric fields, then the displacement of the upper end of the parallel vibratory actuator 106 will be the same regardless of which piezoelectric actuator body 11 is excited. In FIG. 9E, the second actuator device 22 is once again deactivated, the upper end of the parallel vibratory actuator 106 returns to its rest position, and the cycle may be repeated.

The relationship between the input displacements produced by the individual actuator bodies 11 and the output displacement produced at the upper end of the parallel vibratory actuator 106 may be once again illustrated by the graphical representations of FIGS. 5A, 5B and 6. Because the upper end of the parallel vibratory actuator 106 is displaced every time either of the individual actuator bodies 11 is excited, the upper end of the parallel vibratory actuator 106 is displaced twice as often as either of the two individual actuator devices 21, 22. Also, because the displacements of the individual actuator bodies 11 are chosen to be uniform, the displacement of the upper end of the parallel vibratory actuator 106 is likewise uniform. Further, because excitation of the second actuator device 22 is 180 degrees out of phase from that of the first actuator device 21, the upper end of the parallel vibratory actuator 106 is displaced precisely at an operating frequency that is exactly twice the displacement frequency of either of the two individual actuator devices 21, 22. Finally, as with the first embodiment, it should be apparent that these same principles may theoretically be applied to any number of actuator bodies.

Figure 10:
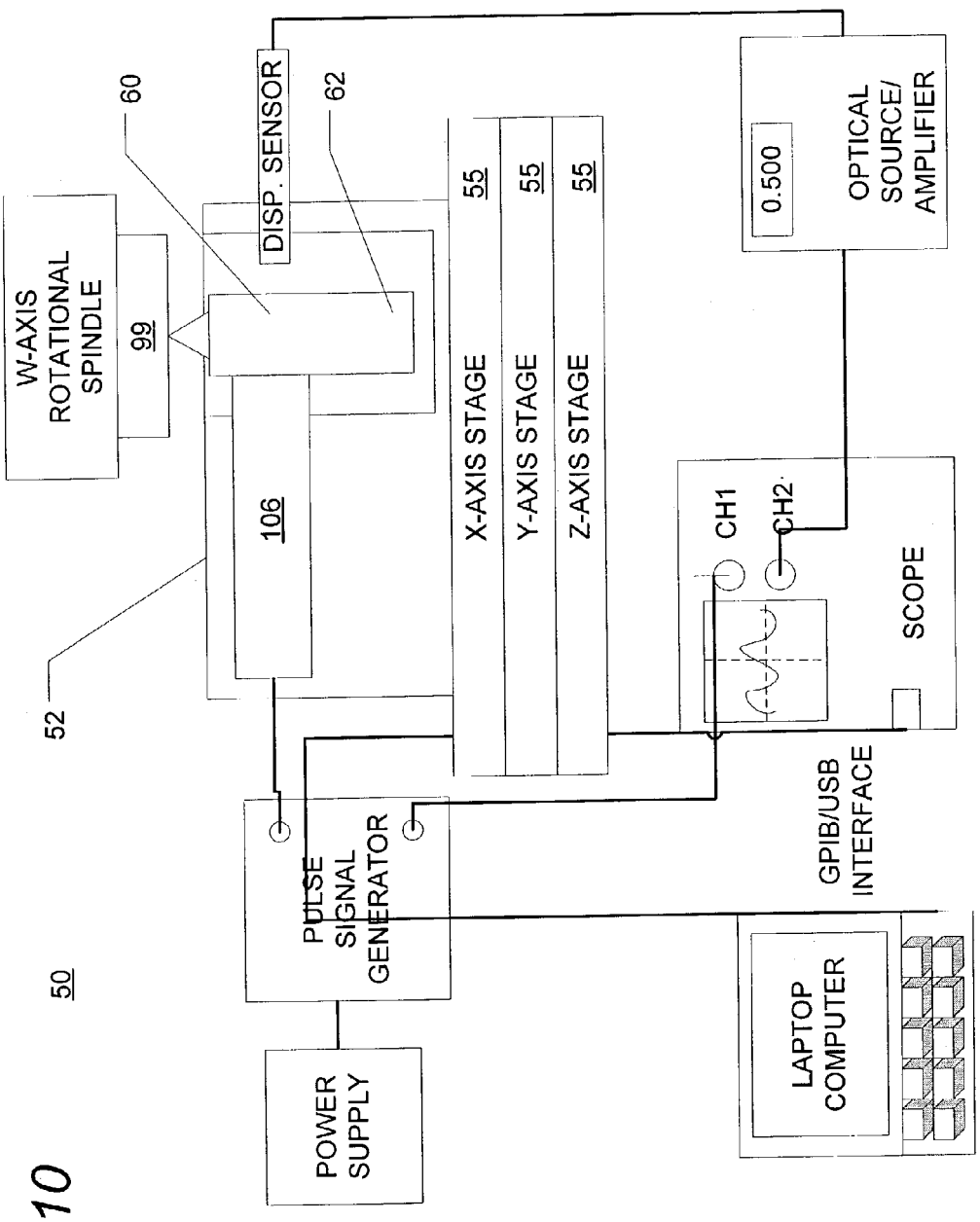
FIG. 10 is a block diagram of a tunable machining device for vibration assisted diamond turning utilizing a vibrator.
Figure 11:
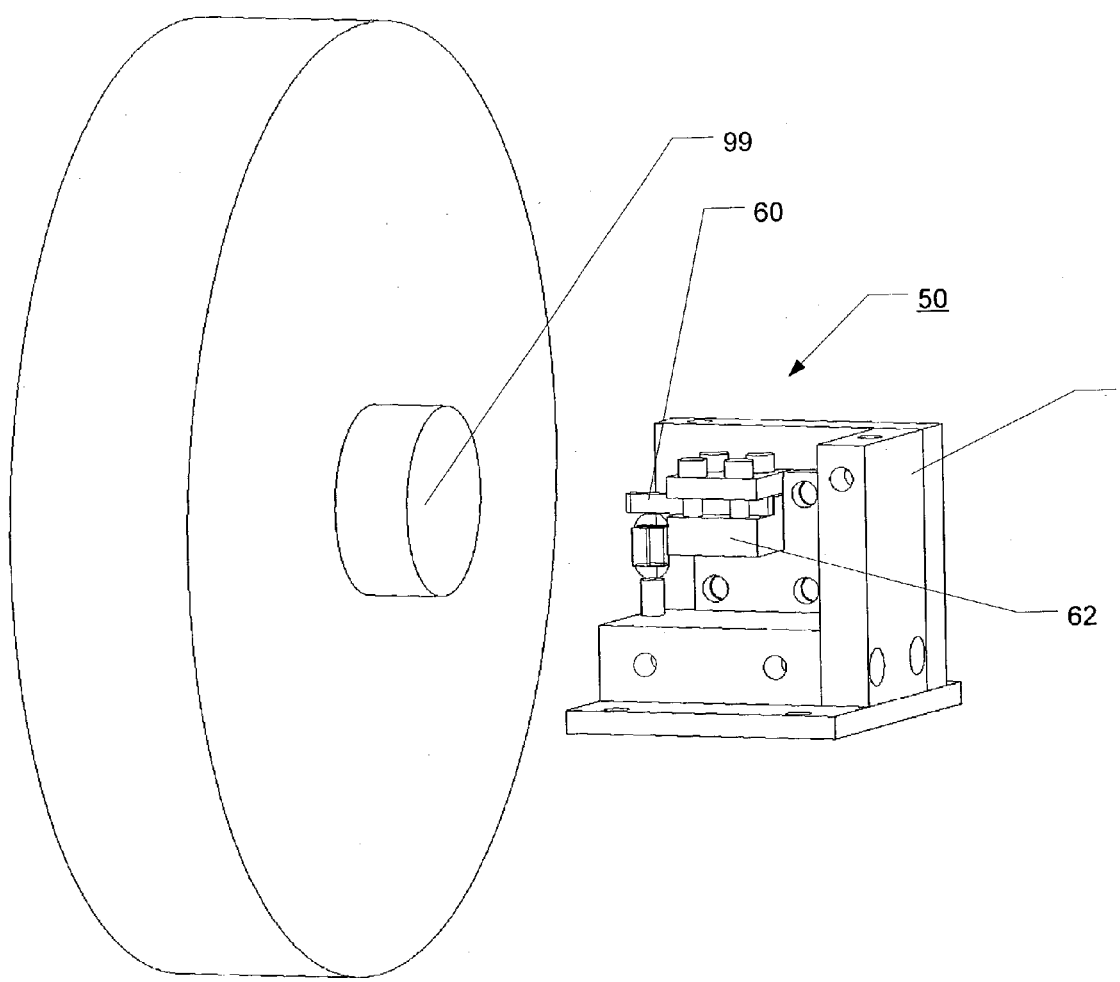
FIG. 11 is a perspective view of an exemplary embodiment of a vibrator, cutting tool assembly and frame, shown in relation to a rotating workpiece.

FIG. 10 is a block diagram of a tunable machining device 50 for vibration assisted diamond turning utilizing a vibrator 105, while FIG. 11 is a perspective view of an exemplary embodiment of a vibratory actuator 106, a cutting tool assembly 51 and a frame 52, shown in relation to a rotating workpiece 99. As illustrated therein, the tunable vibratory machining device 50 includes a vibratory actuator 106, a cutting tool assembly 51, a frame 52, a frame positioning system 54, a pulse generator 56 and a power supply 58. The vibratory actuator 106 includes a plurality of piezoelectric actuator bodies 11 arranged in a parallel configuration, as shown in FIG. 7. As described previously, a series vibratory actuator 6, such as the one shown in FIG. 1, may alternatively be utilized. However, one disadvantage of a series arrangement is that although the piezoelectric actuator body 11 closest to the flexure moves only the mass of the flexure itself, other actuator bodies 11 in the series must move not only the mass of the flexure, but also the mass of all intervening piezoelectric actuator bodies 11. This places asymmetric forces on the various actuator bodies 11 and makes it difficult to maintain the uniformity of the vibrations.

The cutting tool assembly 51 includes a cutting tool 60 supported by a cutting tool mount 62. As shown in FIG. 11, the cutting tool assembly 51 is supported by the frame 52 such that the cutting tool is disposed adjacent to, and in contact with, the vibratory actuator 106. As shown, the flexure of the cutting tool 60 is cantilevered, but it should be apparent that other flexures may likewise be used. For example, the cantilevered flexure of FIG. 11 may be replaced by a torsional flexure similar to the one shown in FIG. 1. However, torsion-based flexures suffer from some drawbacks. First, it is more difficult to incorporate a cutting edge in the flexure without significantly mass-loading the system and lowering the natural frequency. Also, the design of a suitable torsion flexure is complex, involving consideration of three primary modes of vibration (the cantilever arm, the shaft translation, and the shaft rotation) and thus the design is not easily altered. Thus, a flexure in the form of a cantilever beam is generally preferred for its ease of design.

The cutting tool 60 may be constructed from a variety of known and readily available materials, using known machining or other manufacturing techniques, and may include a diamond cutting tip or the like affixed to the flexure. An example of a cutting tool suitable for use in the preferred embodiments of the present invention is a beam, machined from micro-grain carbide with wire electrical-discharge machining, with a nominal nose radius of one millimeter.

The vibratory actuator 106 and the cutting tool assembly 51 are held in fixed relationship by the frame 52. The frame 52 illustrated in FIG. 11 was created for test and verification purposes and is not intended to be a commercial embodiment of the present invention, but is nevertheless suitable for use with the present invention. The illustrated frame 52 may be produced by fastening various structural components together to produce the necessary mounting surfaces and locations. The structural components may be constructed or formed from any material capable of reliably supporting the vibrator 5 and the cutting tool assembly 50 despite the ultrasonic vibrations generated thereby, including steel, invar, and the like.

As shown schematically in FIG. 10, the frame positioning system 54 includes one or more slideways or stages 55 for moving the frame 52 in one or more directions relative to the workpiece 99, a controller (not shown) for each stage 55, and a support system (not shown) for connecting the frame 52 to the stages 55. Preferably, each stage 55 is arranged to move the frame 52 independently along one axis under the control of its controller, although this is not a requirement. If movement in two dimensions is desired, then the first stage 55 is arranged to move the frame 52 along one axis, typically referred to as the "x-axis," while the second stage 55 is arranged to move the frame 52 along an axis, typically referred to as the "y-axis," that is perpendicular to the first axis. Similarly, if movement in three dimensions is desired, then the third stage 55 is arranged to move the frame 52 along an axis, typically referred to as the "z-axis," that is perpendicular to both of the other two axes. In this way, the frame 52, and thus the cutting tool 60, may be moved as desired, relative to the workpiece 99, under the control of the various controllers.

The tunable machining device 50 further includes a pulse signal generator and power supply, a workpiece support, such as a rotational spindle rotatable about the w-axis, a displacement sensor and optical source/amplifier for feeding back information about the displacement of the cutting tool to more precisely control its operation, a scope for viewing and analyzing the input signal or signals and the feedback signal, and a computer for further analysis. The pulse signal generator, the design of which would be apparent to one of ordinary skill in the art, should preferably be capable of generating multiple signals of uniform signal but phase shifted relative to each other by a controllable amount. Multiple wires or cables, such as BNC cables, may be used to communicate the input signals to the respective actuator devices 10. The signals may likewise be provided to the scope; these signals may either be provided separately or added together and transmitted to the scope as a single signal. A scope suitable for use in the present invention is a Tektronix TDS2002.

The signal for each actuator body is chosen to be a square-wave pulse-train supplied from a pulse generator with a variable pulse frequency and variable pulse width. A fixed phase shift is maintained between the channels based on the number of actuator bodies. The drive electronics preferably use a single high-voltage power supply for multiple output channels, and may be readily constructed by one of ordinary skill in the art. By choosing the width of the impulse carefully, the dynamic effects in the output signal can be significantly attenuated. The impulse input signal disturbs a broad frequency content which results in a resonant ringing effect that can be observed between the impulses in the output signal at a ringing frequency equal to the first natural frequency of the system. Theory and experiments have shown that a pulse width adjusted to be equal to the time period of the first natural frequency of the flexure system suppresses the ringing effect almost completely. This theory can be used to generate an almost perfect output signal both in simulation and in practice. Much of this theory has been developed for use in modal testing where the excitation force is selected to supply sufficient energy content to excite the modes of vibration.

Based on the foregoing information, it is readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention. Accordingly, while the present invention has been described herein in detail in relation to its preferred embodiment, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof. Although specific terms are employed herein, they are used in a generic and descriptive sense only and not for the purpose of limitation.

What is claimed is:

1. A method of creating vibratory movement in a mechanical flexure via a plurality of actuator devices, the method comprising the steps of:
   periodically applying a first vibrational force, via a first actuator device, to a mechanical flexure, the first vibrational force being applied at a first input frequency with each discrete application of the first vibrational force being of a first duration;
   periodically applying a second vibrational force, via a second actuator device, to the mechanical flexure, the second vibrational force being applied at a second input frequency with each discrete application of the second vibrational force being of a second duration and at a phase shift from the first vibrational force; and
   selectively establishing and varying at least one of the parameters of the interval spacings of the first and second input frequencies and the first and second durations of each vibrational force.

2. The method of claim 1, wherein the at least one parameter is selected in relation to the natural flexural frequency of the mechanical flexure.

3. The method of claim 1, wherein the phase shift is equal to 1 divided by the total number of actuator devices applying vibrational forces to the mechanical flexure.

4. The method of claim 3, wherein exactly two actuator devices are utilized to apply vibrational forces to the mechanical flexure, and wherein the phase shift between the periodic application of the first vibrational force to the mechanical flexure and the periodic application of the second vibrational force to the mechanical flexure is 180 degrees.

5. The method of claim 3, wherein exactly three actuator devices are utilized to apply vibrational forces to the mechanical flexure, and wherein the phase shift between the periodic application of the first vibrational force to the mechanical flexure and the periodic application of the second vibrational force to the mechanical flexure is 120 degrees.

6. The method of claim 1, wherein each of the first and second vibrational forces is applied at a regular input frequency.

7. The method of claim 1, wherein each of the first and second vibrational forces is applied at an irregular input frequency.

8. The method of claim 1, wherein each discrete application of each of the first and second vibrational forces is of a fixed duration.

9. The method of claim 1, wherein the phase shift is not equally divisible by the total number of actuator devices applying vibrational forces to the mechanical flexure.

10. The method of claim 1, wherein the first actuator device is a piezoelectric actuator, and wherein the step of periodically applying a first vibrational force to the mechanical flexure includes activating the piezoelectric actuator by applying an electric field thereto.

11. The method of claim 1, wherein the step of periodically applying the first vibrational force, via the first actuator device, to the mechanical flexure includes translating the periodically-applied first vibrational force to the mechanical flexure via the second actuator device.

12. The method of claim 1, wherein the step of periodically applying each vibrational force to the mechanical flexure includes applying each vibrational force to the mechanical flexure without applying such force to the any other actuator device.

13. The method of claim 1, wherein the mechanical flexure is a torsional flexure.

14. The method of claim 1, wherein the mechanical flexure is a cantilevered flexure.

15. A method of creating vibratory movement in a mechanical flexure via a plurality of actuator devices, the method comprising the steps of:
   establishing a predetermined output frequency of vibration of the mechanical flexure;
   intermittently applying a plurality of discrete vibrational forces to a mechanical flexure via actuation of at least two actuator devices at respective intermittent input frequencies with each discrete application of each vibrational force being of a finite duration;
   staggering the application of the periodic vibrational forces by the actuation of the at least two actuator devices at a predetermined phase shift such that the mechanical flexure vibrates at a second frequency; and selectively controlling the applying and staggering of the vibrational forces of the at least two actuator devices to set the second frequency at the predetermined output frequency as a mathematical product of the input frequencies times the number of separate actuator devices utilized in the step of applying a plurality of periodic vibrational forces to the mechanical flexure.

16. The method of claim 15, wherein the plurality of discrete vibrational forces are periodically applied via each actuator device at a regular input frequency with each discrete application of each vibrational force of a fixed duration.

17. The method of claim 15, further comprised by tuning the vibrational forces relative to the mechanical flexure by selectively establishing and varying at least one of the parameters of the regularity of the input frequencies and the durations of each vibrational force.

18. A tuneable piezoelectric vibratory actuator comprising:
   a plurality of piezoelectric actuator devices, the plurality of piezoelectric actuator devices collectively having at least one free end, wherein each actuator device includes a piezoelectric body that expands along an axis of expansion when subjected to an electric field;
   an activation circuit arrangement for separately controlling activation of each actuator device;
   a coupler, disposed at the at least one free end of the plurality of piezoelectric actuator devices, for translating individual forces applied thereto by the separately-controlled actuator devices to a common actuation point; and
   a control arrangement for selectively establishing and varying at least one of the parameters of a periodic regularity of an input frequency of discrete activations of each actuator device and a fixed duration of each discrete activation of each actuator device to apply a selectable vibrational force to a mechanical flexure, the selectability of the control arrangement enabling tuning of the vibrational forces relative to the mechanical flexure.

19. The piezoelectric vibratory actuator of claim 18, wherein the coupler is hemispheric in shape.

20. The piezoelectric vibratory actuator of claim 18, wherein one end of each piezoelectric actuator device is disposed in direct contact with the coupler.

21. The piezoelectric vibratory actuator of claim 18, wherein the free end of the plurality of piezoelectric actuator devices is a first end, wherein the plurality of piezoelectric actuator devices collectively have a second end opposite the first end, and wherein the vibratory actuator further comprises a second coupler, disposed at the second end of the plurality of piezoelectric actuator devices.

22. The piezoelectric vibratory actuator of claim 18, wherein the control arrangement selectively establishes and varies the at least one for tuning of the vibrational forces relative to a natural flexural frequency of the mechanical flexure.

* * * * *